(12) United States Patent
Wenger

(10) Patent No.: US 6,239,730 B1
(45) Date of Patent: May 29, 2001

(54) METHOD AND DEVICE FOR MAXIMIZING THE RATIO BETWEEN SIGNAL AND QUANTIZATION NOISE WHEN CONVERTING BETWEEN ANALOGUE AND DIGITAL FORM OF A MULTI-CARRIER SIGNAL

(75) Inventor: Fabian Wenger, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/438,262

(22) Filed: Nov. 10, 1999

(30) Foreign Application Priority Data

Nov. 11, 1998 (SE) .................................................... 9803856

(51) Int. Cl.[7] ...................................................... H03M 1/00
(52) U.S. Cl. .......................... 341/139; 341/155; 455/138; 455/308
(58) Field of Search ................................. 341/139, 155; 455/138, 308, 309, 310

(56) References Cited

U.S. PATENT DOCUMENTS

| | | | |
|---|---|---|---|
| 5,546,081 | * | 8/1996 | Baumgartl ............................ 341/139 |
| 5,557,638 | * | 9/1996 | Fisher et al. ......................... 375/286 |
| 5,687,285 | * | 11/1997 | Katayanagi et al. ................ 395/2.35 |
| 5,841,385 | * | 11/1998 | Xie ....................................... 341/139 |
| 6,002,352 | * | 12/1999 | El-Ghoroury et al. ............. 341/139 |

FOREIGN PATENT DOCUMENTS 58-29212    2/1983 (JP) .
2-13112     1/1990 (JP) .

OTHER PUBLICATIONS

EP0420545 A (General Electric Co) 1991–04–03 (abstract) World PatentsIndex (online), London, UK, Derwent Publications, Ltd. (retrieved on 1999–08–18), retrieved from EPO WPI Database DW9114.

* cited by examiner

Primary Examiner—Howard L. Williams
(74) Attorney, Agent, or Firm—Nixon & Vanderhye, P.C.

(57) ABSTRACT

Device (200; 500) for minimizing the quantization noise in conversion between analogue and digital form of a multi-carrier signal comprising an AC component ($V_{AC}$) with a particular RMS value ($V_{RMS}$). The device comprises means (230; 530) for converting between analogue and digital form with a limited number (b) of bits within a quantization range ($\pm V_{QR}$), means (215,235,245,255; 520) for minimizing the noise by creating an ideal ratio (VQR/VRMS) between the quantization range and the RMS value of the AC component, and means for reducing unwanted DC components in the signal and centering the signal by the wanted DC components being placed in the centre of the quantization range. The device is characterized by the fact that it comprises means (235,245,255; 520) for calculating a scaling factor a for the AC component which is used to create an ideal ratio between the root mean square value, the RMS value, of the signal and the quantization range ($\pm V_{QR}$), means (215; 510) for multiplication of the AC component by the scaling factor α before the conversion (230; 530), whereby the required ratio ($V_{QR}/V_{RMS}$) between the RMS value of the AC component ($V_{RMS}$) and the quantization range ($V_{QR}$) is obtained.

9 Claims, 4 Drawing Sheets

METHOD AND DEVICE FOR MAXIMIZING THE RATIO BETWEEN SIGNAL AND QUANTIZATION NOISE WHEN CONVERTING BETWEEN ANALOGUE AND DIGITAL FORM OF A MULTI-CARRIER SIGNAL

TECHNICAL FIELD

The present invention relates to a method and a device for maximizing the ratio between signal and quantization noise when converting a multi-carrier signal from analogue to digital form with a limited number of bits within a particular quantization range. The invention can also be used for maximizing the ratio between signal and quantization noise when converting a multi-carrier signal from digital to analogue form.

CURRENT TECHNOLOGY

A technique which is often used in modern digital telecommunication systems is so-called multi-carrier systems, in other words a system where a number of carrier waves at different frequencies are used to transmit information within one and the same interval of time. An advantage of multi-carrier systems is that as the same information is transmitted at different frequencies, the effect of multi-wave propagation is counteracted, which is particularly desirable especially in very built-up areas, for example in inner-cities.

For transmission in a multi-carrier system the signal has to be converted from digital to analogue form, which is carried out in a so-called digital-to-analogue converter, usually called an ADC (Analogue to Digital Converter). In an ADC a certain amount of so-called quantization noise always arises, which is caused by the ADC only having access to a limited number of bits. Multi-carrier systems utilize signals with relatively large dynamics, which means that in a digital signal a relatively large number of bits is required in order to obtain the required resolution. This in turn means that the quantization noise can become particularly troublesome in a multi-carrier system.

The distance between the bits in an ADC is called the quantization interval. The bits to which the ADC has access define in addition a so-called quantization range which must be correctly placed in relation to the signal received in order to minimize the quantization noise.

A common method of minimizing the quantization noise is to assume that the amplitude of the received signal is equally divided between all the quantization intervals, and that each quantization interval thus contributes equally towards the quantization noise. According to this assumption, the noise decreases monotonically with the quantization range. As this method does not take into account the error contribution from the part of the signal which ends up outside the quantization interval, the method is not able to minimize the noise correctly. Nor can the method be used to minimize the noise as a function of the quantization range.

SUMMARY OF THE INVENTION

The problem which is solved by the present invention is thus to minimize the quantization noise which arises in conversion between analogue and digital form of a multi-carrier signal. The signal comprises an AC component which has a certain RMS value, and the conversion can be carried out with a particular limited number of bits within a quantization range.

The signal may possibly also comprise a DC component, which can be wanted or unwanted. A wanted DC component means that the DC level is used to transmit information, an unwanted DC component means that the level is only to be regarded as interference which should be removed.

According to the invention, the quantization noise is minimized by creating an ideal ratio between the quantization range and the RMS value of the AC component (RMS= Root Mean Square).

Unwanted DC components in the signal are removed, and if the signal comprises a wanted DC component the signal is centred by the wanted DC component being placed in the centre of the quantization range. Before the conversion takes place, a scaling factor is calculated, which is used to create an ideal ratio between the RMS value of the AC component and the quantization range of the ADC. Thereafter, the AC component is multiplied by the scaling factor, which means that the required ideal ratio between the quantization range and the RMS value of the AC component is obtained.

In a preferred embodiment, the scaling factor is calculated as a factor which minimizes the ratio between the quantization noise and the AC component, taking into account the number of bits which can be used for the conversion.

In an alternative embodiment of the invention, the scaling factor is calculated as a factor which minimizes the expected value of the quantization noise for the type of distribution of the AC component taking into account the number of bits which can be used for the conversion. In this embodiment, the type of distribution of the AC component is also determined.

If the type of distribution of the signal is Gaussian, the logarithmic value of the ideal ratio between the quantization range and the RMS value of the AC component can be expressed as $20*\log_{10}(V_{QR}/V_{RMS})=6.26+0.71*b$, where $V_{QR}$ is the accessible quantization range, $V_{RMS}$ is the RMS value of the AC component, and b is the accessible number of bits for the conversion.

The invention can be used to minimize the quantization noise both when converting a multi-carrier signal from digital form to analogue and when converting a multi-carrier signal from analogue to digital form. The invention is mainly intended to the used in an OFDM system (Orthogonal Frequency Division Multiplex), but can in principle be used in all multi-carrier systems.

BRIEF DESCRIPTION OF THE FIGURES

In the following, the invention will be described in greater detail, utilizing examples of embodiments and with reference to the attached figures, where.

PREFERRED EMBODIMENTS

Figure 1:
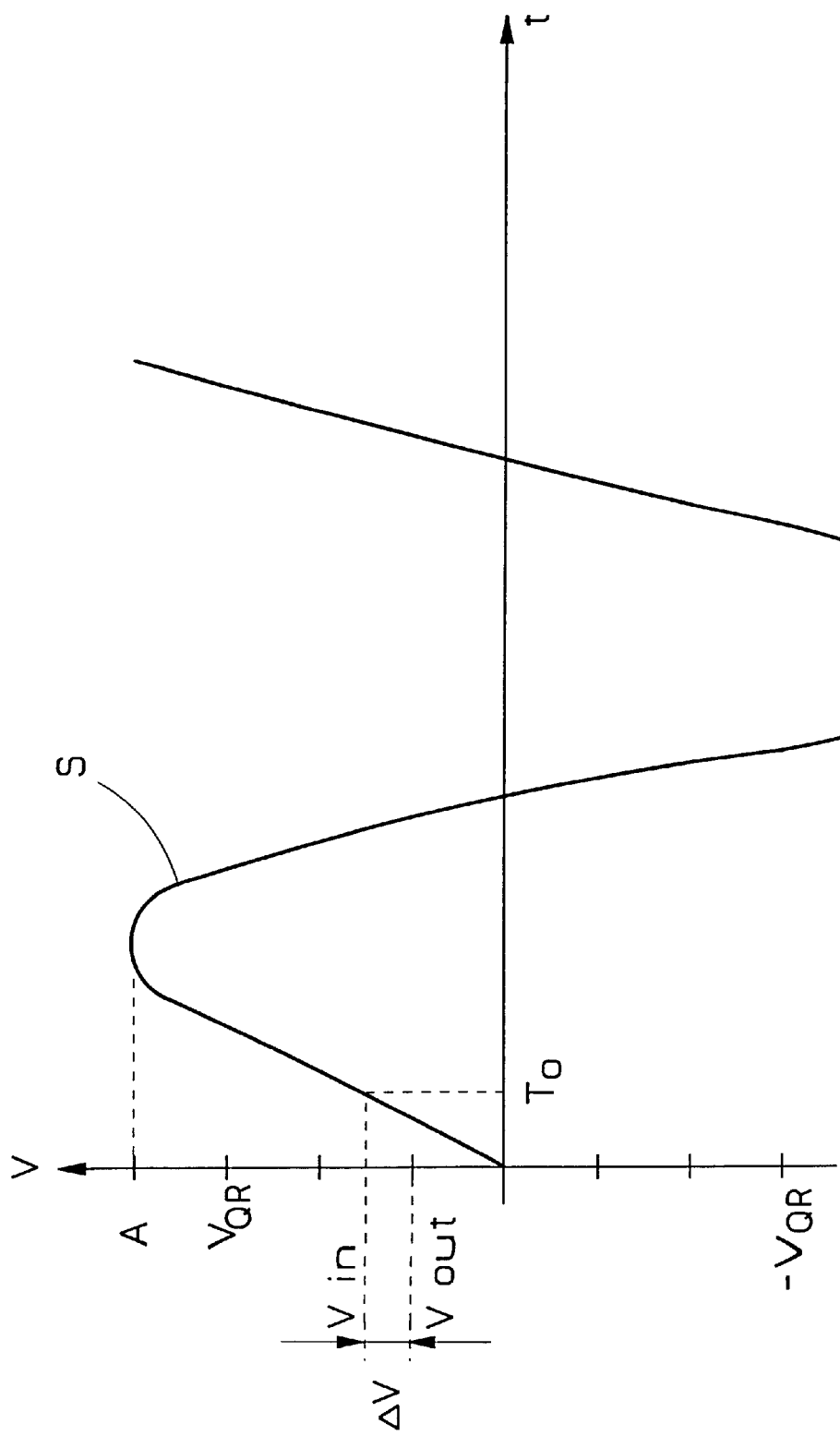
FIG. 1 shows the cause of quantization noise.

FIG. 1 shows how quantization noise arises in conversion of an analogue signal S to digital form. The signal S has a greatest amplitude A and is to be converted to digital form by an ADC (Analogue to Digital Converter) which will take place at certain times T, so-called sampling times. For each sampling time, the ADC provides a digital value as an output signal. The ADC has a particular quantization range $\pm V_{QR}$, and can utilize a limited number of bits, six in the example shown.

The example in FIG. 1 shows a sampling time $T_0$ when conversion takes place from analogue to digital form. The signal S has the amplitude $V_{in}$ at the time $T_0$, but on account of the limited number of bits in the ADC, the value which the ADC perceives will be the closest value in the quantization range, $V_{out}$. On account of this, an error $\Delta V = V_{in} - V_{out}$, arises in the conversion at the time $T_0$.

The quantization noise for the whole conversion is defined as:

$$\int \Delta V^2 dt$$

where the integration is carried out during the time when reception takes place.

An additional cause of quantization noise is shown in FIG. 1. At certain times the amplitude A of the signal exceeds the quantization range $\pm V_{QR}$ of the ADC, which means that during the conversion of the signal at these times the error $\Delta V$ can become very large. This phenomenon is called clipping.

According to the invention, the ratio between the signal and the quantization noise during the conversion is to be maximized. This ratio is often called SQNR, Signal to Quantization Noise Ratio. In order to be able to achieve this maximization, the signal S should be placed in relation to the quantization range $\pm V_{QR}$ in such a way that the ratio $$\frac{\int \Delta V^2 dt}{\int V_{in}^2 dt} = \frac{1}{SNQR}$$

is minimized.

Figure 2:
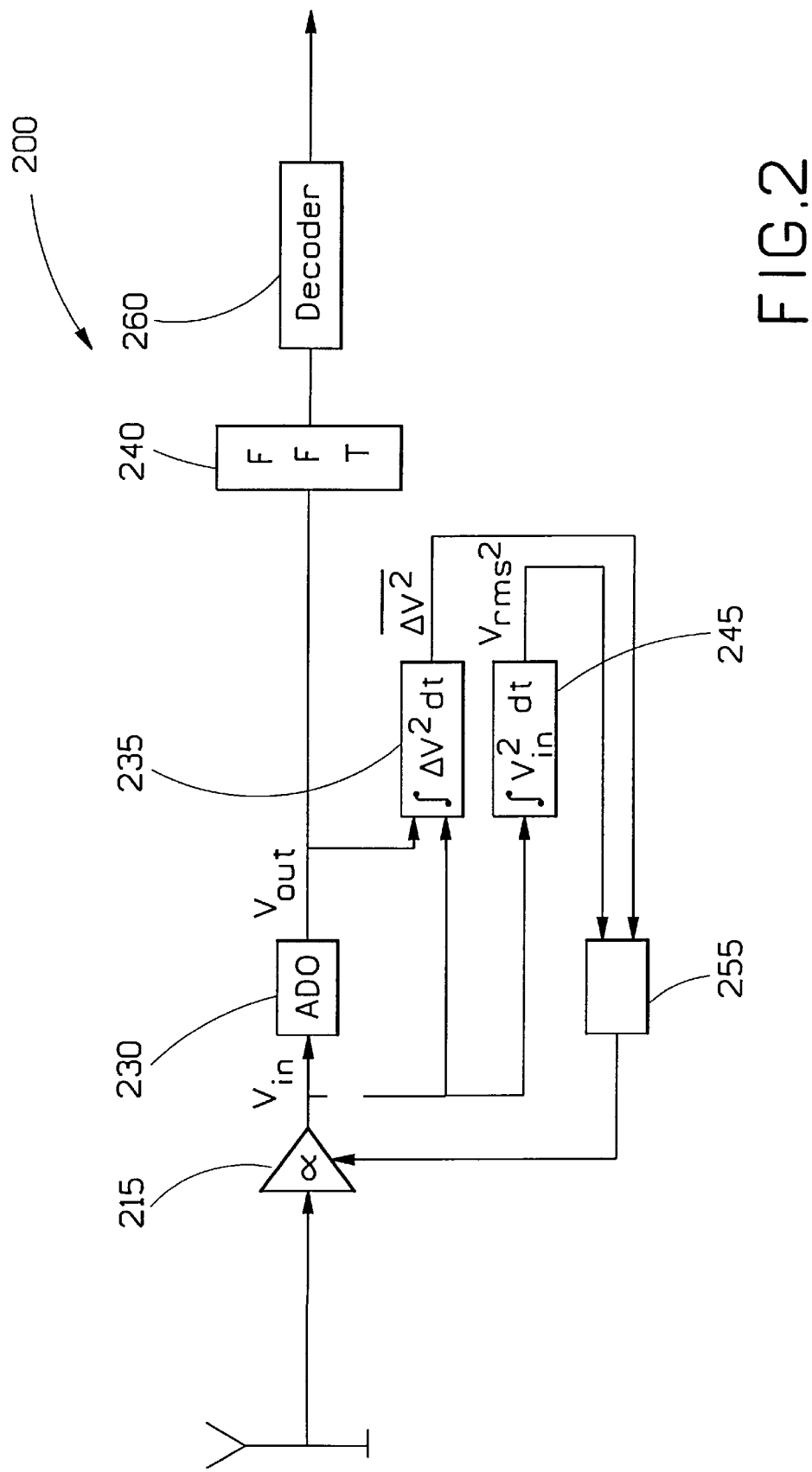
FIG. 2 shows a rough block diagram of a receiver according to the invention.

FIG. 2 shows a rough block diagram for a receiver 200 according to the invention. The function blocks in FIG. 2 can also be regarded as the main steps in a method according to the invention.

The block diagram shows a receiver 200 in connection with which AID conversion according to the invention will be explained. It should, however, be pointed out that the invention can be used for D/A conversion in a transmitter with equally good results. The invention is mainly intended for use in a receiver in an OFDM system, but can in principle be used in a receiver in any multi-carrier system.

The receiver in FIG. 2 comprises an ADC 230, a device 240 for FFT and a decoder 260. In addition, the receiver comprises a variable amplifier 215, two integrators 235, 245, and a control unit 255. The interaction of these instruments will be described in greater detail below.

As shown in FIG. 2, the signal is received, amplified by a suitable factor in the amplifier 215 and converted to digital form in the ADC 230.

In order to maximize the ratio between signal and quantization noise during A/D conversion, the receiver 200 according to the invention multiplies the signal in the amplifier 215 by a scaling factor $\alpha$. The scaling factor $\alpha$ is calculated in the calculation unit 255.

In order to maximize the ratio between signal and quantization noise, the scaling factor a should be calculated so that an ideal ratio is created between the received signal and the quantization range of the ADC. In particular, an ideal ratio is to be created between the RMS value (RMS=Root Mean Square) of the signal and the quantization range $\pm V_{QR}$ of the ADC.

The scaling factor can be calculated in a number of ways. In a preferred embodiment of the invention, the scaling factor is calculated in such a way as to minimize, taking into account the number of bits which can be utilized for the conversion, the ratio between the quantization noise and the signal or alternatively to maximize the inverse of this expression. In this embodiment of the invention, the scaling factor a is calculated by minimizing the expression:

$$\frac{\int \Delta V^2 dt}{\int V_{in}^2 dt}$$

This minimizing is carried out by the two integrals $$\int \Delta V^2 dt$$

and $$\int V_{in}^2 dt$$

continuously being calculated upon reception.

The integral in the numerator is calculated using a first integrator 235 which detects the signal before and after the ADC and can thus calculate the time integral of the quantization noise. The integral in the denominator is calculated using a second integrator 245 which continuously detects the value of the input signal and can thus calculate the integral in the denominator.

Output data from the two integrators 235, 245 is linked to a calculation unit 255 which, using output data from the two integrators calculates the optimal value of the scaling factor $\alpha$. The calculation of the scaling factor can be carried out at certain times or essentially continuously.

The invention can be utilized for signals of practically any type of distribution. In a common embodiment, the invention is used in an OFDM system where the signals have Gaussian distribution, in other words normal distribution.

As this is the most common application of the invention, a numerical value of the scaling factor $\alpha$ has been calculated for this type of distribution.

What is to be maximized is the ratio between $V_{QR}$ and $V_{RMS}$, which is suitably expressed logarithmically, whereby the calculations give the ideal ratio:

$$20\log_{10}(V_{QR}/V_{RMS}) = 6.26 + 0.71 \cdot b \quad (2)$$

where b is the number of bits the ADC has accessible.

As $V_{RMS}$ is proportional to the scaling factor $\alpha$, $20\log_{10} V_{QR}/V_{RMS}$ can be reduced or increased by increasing or reducing $\alpha$ in the required way. This applies regardless of the type of distribution of the signal.

The quantization noise can, as mentioned above, also be expressed in relation to the signal, in other words as SQNR, Signal to Quantization Noise Ratio. According to the invention, the ideal value of SQNR can be calculated from (2):

$$SQNR = -3.42 + 5.52 \cdot b \quad (3)$$

where b is the number of bits the ADC has accessible.

Figure 3:
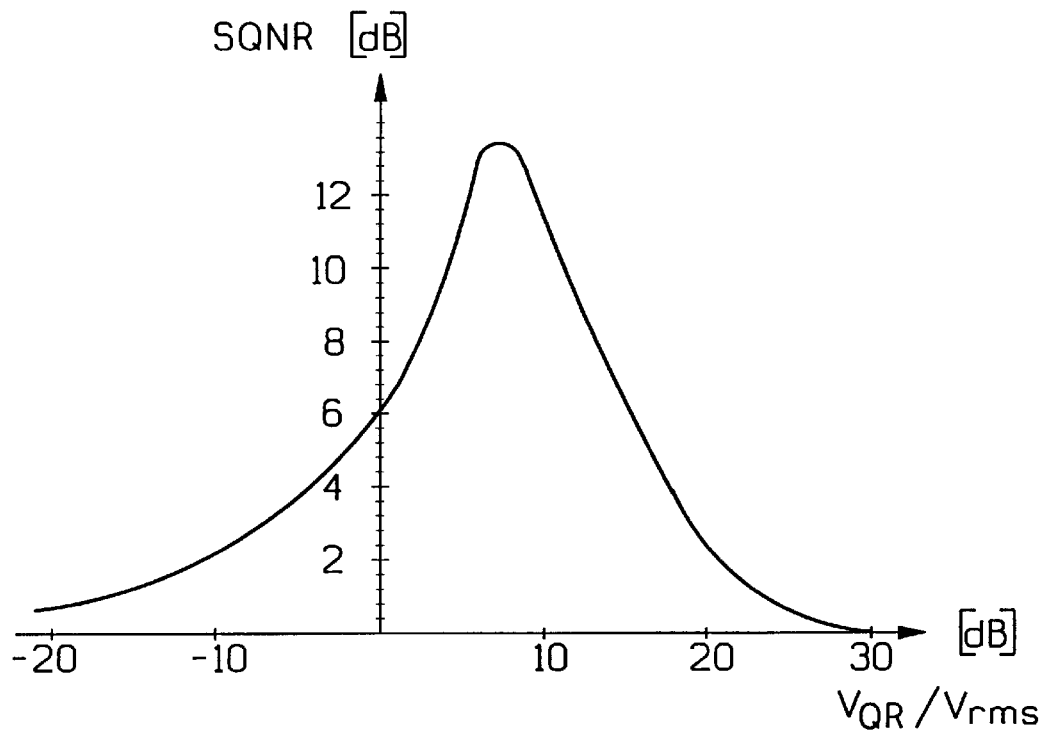
FIG. 3 shows the ratio between signal and quantization noise for different scaling factors according to the invention.

FIG. 3 shows a graph in decibels (dB) of SQNR as a function of $V_{QR}/V_{RMS}$ for an ADC with three bits. The horizontal axis shows in other words $20 \cdot \log_{10} V_{QR}/V_{RMS}$ and the vertical axis shows SQNR in decibels. As shown by the graph, SQNR has a maximum of 14 dB at a point which approximately corresponds to $V_{QR}/V_{RMS}$=9 dB. From the graph it can thus be seen that in an ADC with three bits, the scaling factor α is to be selected so that $20*\log_{10}V_{QR}/V_{RMS}$=9.

Figure 4:
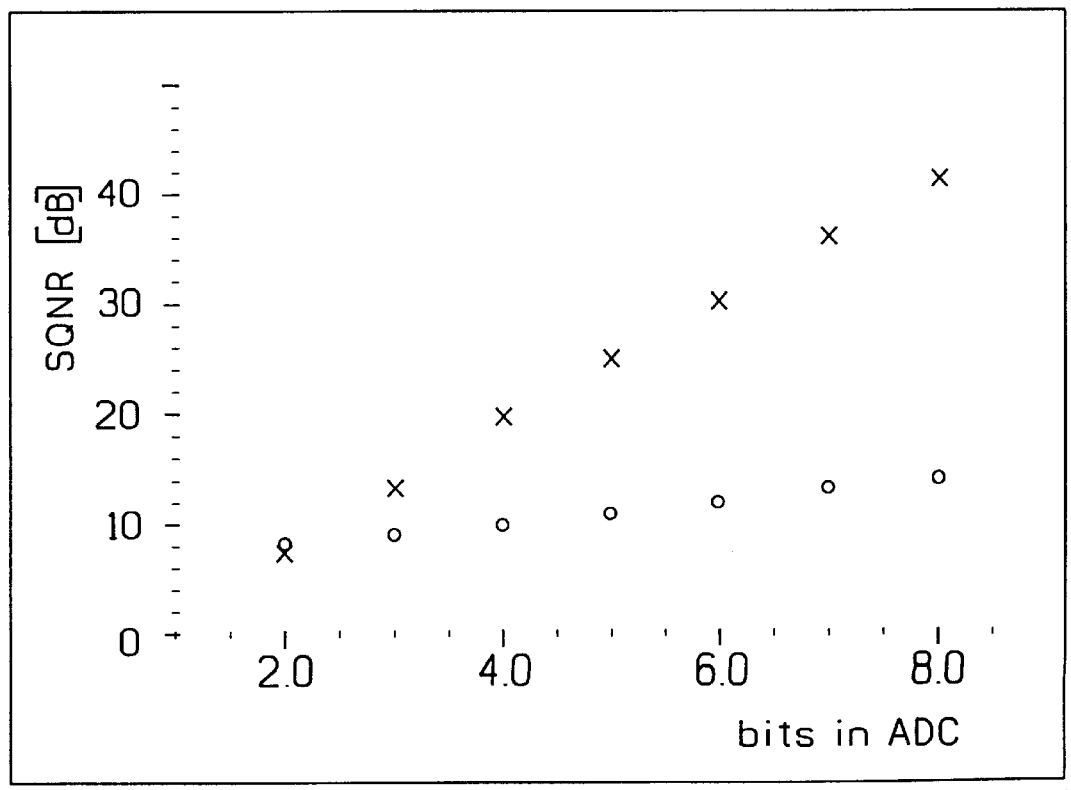
FIG. 4 shows a diagram of the scaling factors and corresponding ratio between signal and quantization noise.

FIG. 4 shows a diagram of the value in decibels of $V_{QR}/V_{RMS}$ and SQNR as a function of the accessible number of bits in an ADC. The graph is to be read in the following way: For a particular given number of bits in the ADC, the symbol x shows the optimal value which can be obtained for SQNR and the symbol ° shows the ratio between $V_{QR}/V_{RMS}$ at the indicated ideal value of SQNR.

In order to clarify how the diagram in FIG. 4 is to be read, the example from FIG. 3 can be used with an ADC with three bits, which has also been drawn in on the diagram: An ADC with three bits has the symbol ° at 9 dB, which is the value of $V_{QR}/V_{RMS}$ which gives the optimal SQNR. For the same number of bits the symbol x shows that the optimal SQNR is 14 dB, which is the same value as has been shown in connection with FIG. 3. In a corresponding way, it is possible to read out from the diagram what value of $V_{QR}/V_{RMS}$ gives the optimal SQNR for any number of bits and what the optimal value of SQNR is.

It has been shown above that the scaling factor α is calculated according to the invention as a factor which minimizes the ratio between two integrals in the time plane. The scaling factor can also be calculated as a factor which minimizes the ratio between two integrals which are integrated over the voltage, dV.

This can also be expressed as the scaling factor a being calculated as a factor which minimizes the expected value of the quantization noise for the type of distribution P of the signal taking into account the number (b) of bits which can be used in the ADC for the conversion.

Figure 5:
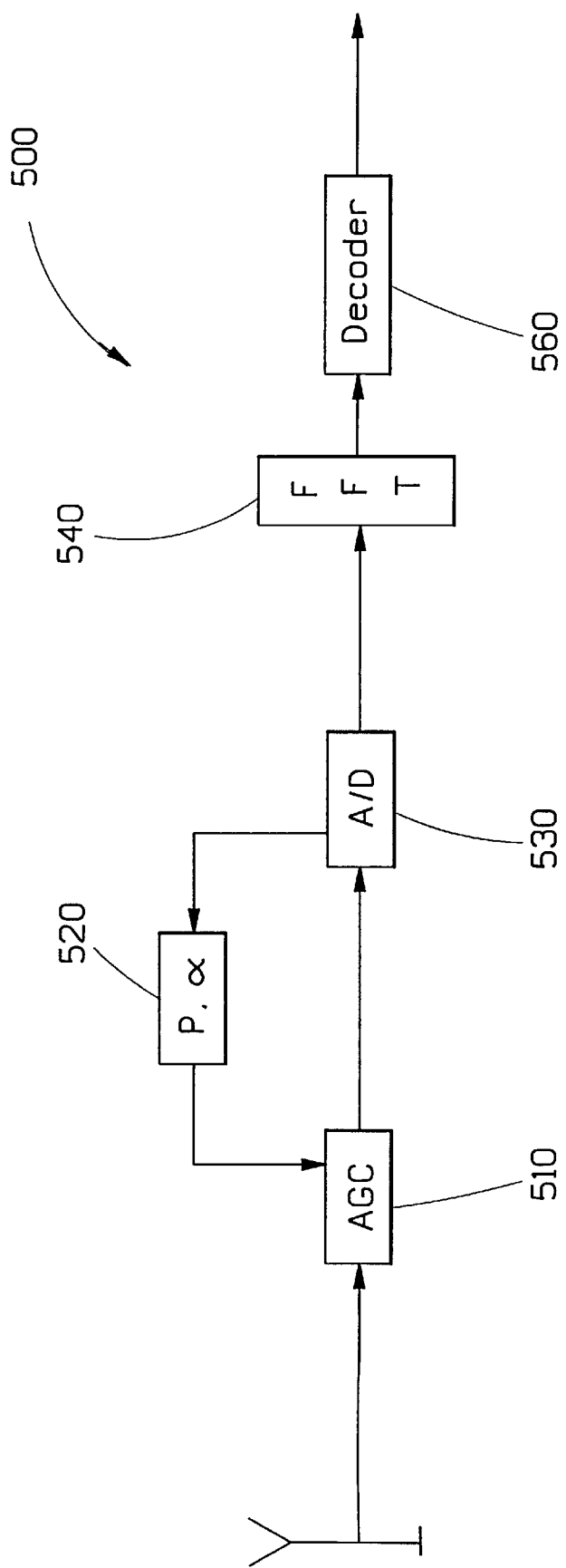
FIG. 5 shows a rough block diagram for a receiver according to the invention.

FIG. 5 shows a receiver 500 according to this embodiment of the invention.

As was the case with the receiver in the previously described embodiment, the receiver 500 comprises a device 510 for automatic sensitivity amplification, AGC (Automatic Gain Control), an ADC 530, a device 540 for FFT and a decoder 560.

In order to calculate the scaling factor α in this embodiment of the invention, the type of distribution P of the signal must be determined, which is carried out in a calculation unit 520 connected between the ADC and the AGC.

The type of distribution P is preferably determined by the calculation unit 520 detecting the values of the signal which comes in to the ADC and determining the type of distribution based on these values. An alternative way can be quite simply to assume that the signal has a particular distribution. If, for example, the type of distribution of the signal is known in advance, of course no calculation is required.

An example of a common type of distribution in these kinds of applications is Gaussian distribution, but other types of distribution can also be found.

When the type of distribution P of the signal has been determined, the scaling factor α is to be calculated. This is carried out by the calculation unit calculating the value of the following mathematical expression:

$$\min_{\alpha} \frac{\int_{-\infty}^{\infty} \Delta V^2 P(\alpha V) \alpha dV}{\int_{-\infty}^{\infty} V_{in}^2 P(\alpha V) \alpha dV}$$

where ΔV is the quantization error ($V_{in}-V_{out}$) which has been mentioned above, and P is the type of distribution of the signal.

The integral above shows how the scaling factor α is calculated: The calculation unit 520 calculates the value of the integral of a particular number of α, and the α which gives the lowest value for the integral is used as the scaling factor. This can be carried out by a large number of different methods for minimizing a function with regard to a variable. These methods are known to specialists in this field and will not be described in greater detain here.

The integral has been given above in the interval (−∞, ∞), but in a preferred embodiment it will only be calculated over a limited range which comprises the quantization interval (−$V_{QR}$, $V_{QR}$).

In a variant of this embodiment, the scaling factor α is calculated by summation of the quantization error ΔV instead of by integration.

In a further variant of this embodiment of the invention, the scaling factor α is calculated by initially taking a particular predetermined scaling factor and letting the calculation unit 520 measure the difference between the analogue value of the signal and the digital value to which the signal is converted in the ADC. In this variant of the invention, an error signal is continuously calculated based on the difference, which signal is used to correct the scaling factor and thereby the signal in the required direction.

Also in the embodiment of the invention which has been described in connection with FIG. 5, it is the case that if the signal has Gaussian distribution the abovementioned ideal values can be used, in other words:

$$20\log_{10}(V_{QR}/V_{RMS})=6.26+0.71*b \quad (2)$$

and $$SQNR=-3.42+5.52*b \quad (3)$$

where b is the number of bits accessible to the ADC.

Finally, for the sake of completeness, the functions of the parts of the block diagrams in FIGS. 2 and 5 will be described.

The received signal is a multi-carrier signal, which means that a large number of carrier waves at different frequencies are used to transmit the information simultaneously. In order to be able to recreate the transmitted information in the form of a stream of bits, the digital output signal from the ADC 230, 530 is connected to a device 240, 540 for FFT, Fast Fourier Transform. This is carried out because the transmitter in an OFDM system, for which the receiver 200, 500 in FIGS. 2 and 5 is intended, utilizes IFFT in generating the signal which is to be transmitted.

The OFDM system for which the receiver is intended utilizes 64 frequencies to transmit information simultaneously. The ADC 230, 530, supplies input data to the FFT 240, 540, serially, and when 64 values have been received FFT is carried out, which is then repeated. Out of the FFT comes a parallel stream of 64 values which are connected to a decoder 260, 560 which decodes the symbols into a bit stream according to the modulation method and coding method which have been used in the transmitter. An example of a possible coding method is a convolution code, and possible modulation methods are 16QAM, BPSK, 8DPSK and QPSK.

Throughout the above, the word "signal" has been used. For the sake of clarity it should be pointed out that this expression concerns an AC component in the received signal. If the received signal also contains a DC component this can either be wanted or unwanted. In order not to make the invention more difficult to understand, this has not been included in the description above but can be clarified here:

Unwanted DC components in the signal are removed, and if the signal comprises a wanted DC component the signal is centred by the wanted DC component being placed in the centre of the quantization range. This is suitably carried out before the signal reaches the variable amplifier (215) or the AGC (510).

The invention is not limited to the embodiments described above, but can be varied freely within the scope of the patent claims. In an alternative variant of the invention, for example, the scaling factor α can be used to control the quantization range $\pm V_{QR}$ of the ADC by multiplication by $1/\alpha$. This can, for example, be carried out by the ADC having a separate input for control of the quantization range.

What is claimed is:

1. Method for minimizing the quantization noise when converting between analogue and digital form of a multi-carrier signal comprising an AC component ($V_{AC}$) with a particular RMS value ($V_{RMS}$), which conversion is carried out with a limited number (b) of bits within a quantization range ($V_{QR}$), the noise being minimized by creating an ideal ratio ($V_{QR}/V_{RMS}$) between the quantization range and the RMS value of the AC component, with removal of unwanted DC components in the signal and centering of the signal by wanted DC components being placed in the centre of the quantization range, which method is characterized in that it comprises:

calculation of a scaling factor α for the AC component, which is used to create an ideal ratio between the root mean square value, the RMS value, of the signal and the quantization range $\pm V_{QR}$ of the ADC, multiplication of the AC component by the scaling factor α before the conversion, whereby the required ratio ($V_{QR}/V_{RMS}$) between the RMS value ($V_{RMS}$) Of the AC component and the quantization range ($V_{QR}$) is obtained.

2. Method according to claim 1, according to which the statistical type of distribution P of the AC component is determined, and the scaling factor α is calculated as a factor which minimizes the expected value of the quantization noise for the type of distribution P of the AC component taking into account the number (b) of bits which can be used for the conversion.

3. Method according to claim 1, according to which the scaling factor α is calculated as a factor which minimizes the ratio between the quantization noise and the AC component, taking into account the number (b) of bits which can be used for the conversion.

4. Method according to claim 1, according to which, if the AC component has a Gaussian distribution, the logarithmic value of the ideal ratio ($V_{QR}/V_{RMS}$) between the quantization range and the RMS value of the AC component is considered to be: $20*\log_{10}(V_{QR}/V_{RMS})=6.26+0.71*b$ where b is the accessible number of bits for the conversion.

5. Method according to claim 1, according to which the scaling factor α instead is used to regulate the quantization range by multiplication by $1/\alpha$.

6. Device (200; 500) for minimizing the quantization noise when converting between analogue and digital form of a multi-carrier signal comprising an AC component ($V_{AC}$) with a particular RMS value ($V_{RMS}$), which device comprises:

means (230; 530) for converting between analogue and digital form with a limited number (b) of bits within a quantization range ($\pm V_{QR}$), means (215,235,245,255;520) for minimizing the noise by the creation of an ideal ratio ($V_{QR}/V_{RMS}$) between the quantization range and the RMS value of the AC component, means for reducing unwanted DC components in the signal and centering the signal by the wanted DC components being placed in the centre of the quantization range, which device is characterized by the fact that it comprises:

means (235,245,255; 520) for calculating a scaling factor α for the AC component, which is used in order to create an ideal ratio between the root mean square value, the RMS value of the signal and the quantization range ($+V_{QR}$), means (215; 510) for multiplication of the AC component by the scaling factor α before the conversion (230; 530), whereby the required ratio ($V_{QR}/V_{RMS}$) between the RMS value ($V_{RMS}$) of the AC component and the quantization range ($V_{QR}$) can be obtained.

7. Device according to claim 6, in which the means (235,245,255; 520) for calculating the scaling factor a calculates this as a factor which minimizes the expected value of the quantization noise for the type of distribution P of the AC component, taking into account the number (b) of bits which can be used for the conversion.

8. Device (500) according to claim 6, in which, if the statistical type of distribution P of the AC component is determined to be Gaussian distribution, the means (235,245, 255; 520) for calculating the scaling factor a calculates this so that the logarithmic value of the ideal ratio ($V_{QR}/V_{RMS}$) between the quantization range and the RMS value of the AC component is:

$$20*\log_{10}(V_{QR}/V_{RMS})=6.26+0.71*b$$

where b is the accessible number of bits for the conversion.

9. Device according to any of the claim 6, in which the means (215; 510) for multiplication of the AC component by the scaling factor α is used instead to regulate the quantization range of the ADC (230; 530) by multiplication by $1/\alpha$.

* * * * *